(12) United States Patent
Hiraga

(10) Patent No.: US 6,169,312 B1
(45) Date of Patent: Jan. 2, 2001

(54) STATIC PROTECTION CIRCUIT FOR USE IN A SEMICONDUCTOR INTEGRATED CIRCUIT DEVICE

(75) Inventor: Noriaki Hiraga, Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/128,470

(22) Filed: Aug. 4, 1998

(30) Foreign Application Priority Data

Aug. 8, 1997 (JP) .................................................... 9-214603

(51) Int. Cl.[7] .................................................... H01L 23/62
(52) U.S. Cl. ........................ 257/360; 257/379; 361/91.5
(58) Field of Search ................................. 257/360, 363, 257/379; 361/91.5

(56) References Cited

FOREIGN PATENT DOCUMENTS 62-105462 * 5/1987 (JP) ...................................... 257/360

* cited by examiner

*Primary Examiner*—Mark V. Prenty
(74) *Attorney, Agent, or Firm*—Arent Fox Kitner Plotkin & Kahn PLLC

(57) ABSTRACT

A static protection circuit has a first MOS transistor of a P-channel type whose source-drain channel is connected between a signal line leading to an external connection terminal and ground; it also has a second MOS transistor of a P-channel type. This second MOS transistor has its drain connected to the gate of the first MOS transistor, has its source connected through a first resistor to a power source line, and has its gate connected through a second resistor to ground.

6 Claims, 6 Drawing Sheets

STATIC PROTECTION CIRCUIT FOR USE IN A SEMICONDUCTOR INTEGRATED CIRCUIT DEVICE

BACKGROUND OF THE INVENTION

1. Field of the Invention

The present invention relates to a static protection circuit for use in a semiconductor integrated circuit device.

2. Description of the Prior Art

When a person touches an input or output terminal of a semiconductor integrated circuit device such as an LSI with his hand or finger, abnormal electrostatic charge may be applied to the circuit inside, destroying the semiconductor integrated circuit device. Such application of electrostatic charge from a human hand or finger usually occurs when a semiconductor integrated circuit device is not in operation, for example during the mounting of the semiconductor integrated circuit device onto a circuit board or in the process preparatory thereto.

To prevent destruction caused by electrostatic charge, a semiconductor integrated circuit device usually incorporates a simple protection circuit. FIG. 7 illustrates a conventional example of such a protection circuit. In FIG. 7, numeral 100 represents an I/O (input/output) circuit including a buffer and other components, and numeral 101 represents a signal line leading to a pad 102. The pad 102 is connected to an external output terminal. Numeral 103 represents an N-channel MOS transistor having its drain connected to the signal line 101, having its source connected to ground, and having its gate also connected to ground.

In this circuit, when abnormal electrostatic charge is applied to the pad 102 from the outside, punch-through occurs between the drain and the source of the MOS transistor 103 (i.e. instead of the MOS transistor 103 being turned on in the normal manner, a high voltage applied between the source and the drain causes the source-drain channel to conduct and thereby causes a current to flow therethrough), with the result that the electrostatic charge is bypassed to ground. In this way, the I/O circuit 100 and other internal circuits are protected from destruction.

However, in this conventional example, when abnormal electrostatic charge is applied, the high electrostatic charge applied between the drain D and the gate G of the transistor 103 may destroy the gate insulating film of the transistor 103.

SUMMARY OF THE INVENTION

An object of the present invention is to provide a novel and effective static protection circuit that is so designed that its protection transistor is not destroyed by abnormal electrostatic charge.

To achieve the above object, according to one aspect of the present invention, a static protection circuit for use in a semiconductor integrated circuit device is provided with: a first MOS transistor of a P-channel type whose source-drain channel is connected between a signal line leading to an external connection terminal and ground; and a second MOS transistor of a P-channel type having its drain connected to the gate of the first MOS transistor, having its source connected through a first resistor to a power source line, and having its gate connected through a second resistor to ground.

In this structure, when abnormal electrostatic charge is applied from the external connection terminal, punch-through occurs between the source and the drain of the first MOS transistor, and causes a current to flow from the signal line to ground, thereby discharging the abnormal electrostatic charge quickly. In addition, the gate of the first MOS transistor is brought into an electrically floating state (i.e. a cut-off state) by the second MOS transistor, and therefore the above-mentioned abnormal charge is not applied between the source and the gate of the first MOS transistor. Thus, the gate insulating film of the first MOS transistor is not destroyed.

On the other hand, as for the second MOS transistor, when abnormal electrostatic charge is applied to the power source line, a high voltage appears between the power source line and ground. However, the first and second resistors bear a portion of this high voltage, and accordingly reduce the source-gate voltage of the second MOS transistor. Thus, the gate insulating film of the second MOS transistor is not destroyed, either.

According to another aspect of the present invention, a static protection circuit for use in a semiconductor integrated circuit device is provided with: a first MOS transistor of an N-channel type whose source-drain channel is connected between a signal line leading to an external connection terminal and ground; and a second MOS transistor of an N-channel type having its drain connected to the gate of the first MOS transistor, having its gate connected through a first resistor to a power source line, and having its source connected through a second resistor to ground. Also in this structure, the transistors are protected from destruction.

According to still another aspect of the present invention, a static protection circuit for use in a semiconductor integrated circuit device is provided with: a first MOS transistor of a P-channel type whose source-drain channel is connected between a signal line leading to an external connection terminal and a power source line; a second MOS transistor of an N-channel type whose source-drain channel is connected between the signal line and ground; a third MOS transistor of a P-channel type having its drain connected to the gate of the first MOS transistor, having its source connected through a first resistor to the power source line, and having its gate connected through a second resistor to ground; and a fourth MOS transistor of an N-channel type having its drain connected to the gate of the second MOS transistor, having its gate connected through a third resistor to the power source line, and having its source connected through a fourth resistor to ground.

In this structure, when abnormal electrostatic charge is applied to the signal line, punch-through occurs in both of the first and second MOS transistors, and thereby the abnormal electrostatic charge is bypassed. Thus, it is possible to achieve more secure protection than in the previously-described structures. Moreover, the gates of the first and second MOS transistors are connected to the third and fourth MOS transistors so that they will not receive the abnormal voltage, and therefore the gate insulating films of the first and second MOS transistors are not destroyed. On the other hand, even if abnormal electrostatic charge is applied to the power source line, the voltage applied to the gate insulating films of the third and fourth MOS transistors are reduced by the first to fourth resistors, and therefore the gate insulating films of these MOS transistors are not destroyed, either.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
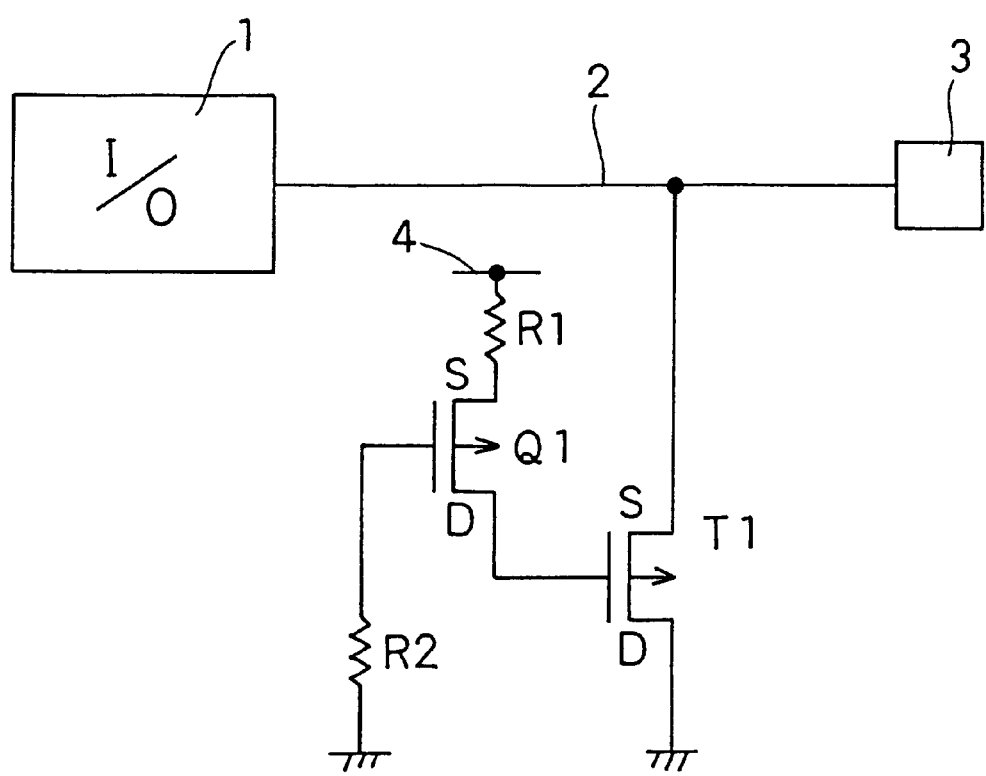
FIG. 1 is a circuit diagram of the static protection circuit for a semiconductor integrated circuit device of a first embodiment of the present invention.

Hereinafter, embodiments of the present invention will be described with reference to the drawings. FIG. 1 shows a first embodiment of the present invention. In FIG. 1, numeral 1 represents an I/O (input/output) circuit including a buffer, numeral 2 represents a signal line, and numeral 3 represents an I/O pad. The pad 3 is connected to an external connection terminal, which protrudes outward from the package of the semiconductor integrated circuit device. T1 represents a P-channel MOS transistor having its source S connected to the signal line 2, having its drain D connected to ground, and having its gate G connected to the drain of another P-channel MOS transistor Q1. The transistor Q1 has its source S connected through a resistor R1 to a power source line 4, and has its gate connected through a resistor R2 to ground.

When abnormal electrostatic charge is applied to the pad 3 from the external connection terminal, punch-through occurs between the drain D and the source S of the MOS transistor T1, and this causes the electrostatic charge to be bypassed from the signal line through the transistor T1 to ground. In this way, the I/O circuit and other circuits are protected from destruction.

At this time, the gate of the transistor T1 is cut off by the transistor Q1, and is thereby kept in an electrically floating state. Thus, the gate insulating film of the transistor T1 does not receive a voltage resulting from the abnormal electrostatic charge on the signal line 2. In this way, the gate insulating film is also protected from destruction.

When abnormal electrostatic charge occurs on the power source line 4, if the resistors R1 and R2 were absent, a high abnormal voltage would be applied between the source and gate of the transistor Q1, destroying the gate insulating film of the transistor Q1. However, in reality, the resistors R1 and R2 bear a portion of the voltage appearing between the power source line 4 and ground, and thereby reduce accordingly the voltage applied to the gate insulating film. In this way, the transistor Q1 is protected also from destruction resulting from the application of abnormal electrostatic charge to the power source line 4.

Figure 2:
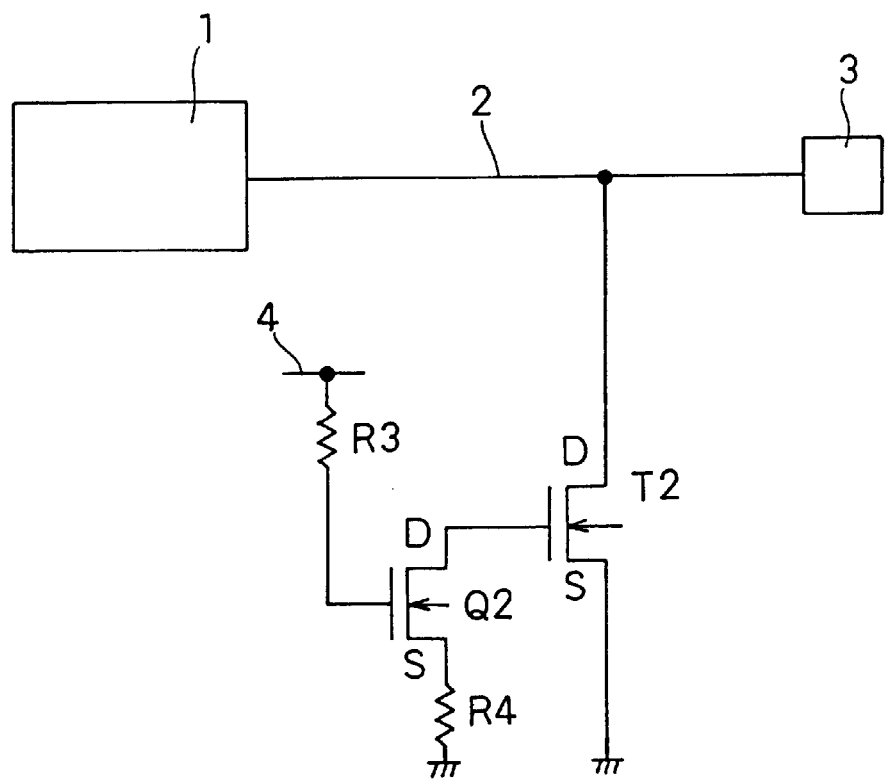
FIG. 2 is a circuit diagram of the static protection circuit for a semiconductor integrated circuit device of a second embodiment of the present invention.

FIG. 2 shows a second embodiment of the present invention. In FIG. 2, such components as are found also in FIG. 1 are identified with the same reference numerals and symbols. In contrast with the first embodiment where P-channel MOS transistors T1 and Q1 are used to form a protection circuit, in the second embodiment, N-channel MOS transistors T2 and Q2 are used instead.

The transistor T2 has its drain connected to the signal line 2, has its source connected to ground, and has its gate connected to the drain of the transistor Q2. The transistor Q2 has its gate connected through a resistor R3 to the power source line 4, and has its source connected through a resistor R4 to ground.

Here, the transistor T2 serves the same function as the transistor T1 of the first embodiment, and the transistor Q2 and the resistors R3 and R4 serve the same functions as the transistor Q1 and the resistors R1 and R2, respectively, of the fist embodiment. Accordingly, no description will be repeated as to the protection operation of the circuit shown in FIG. 2.

Figure 3:
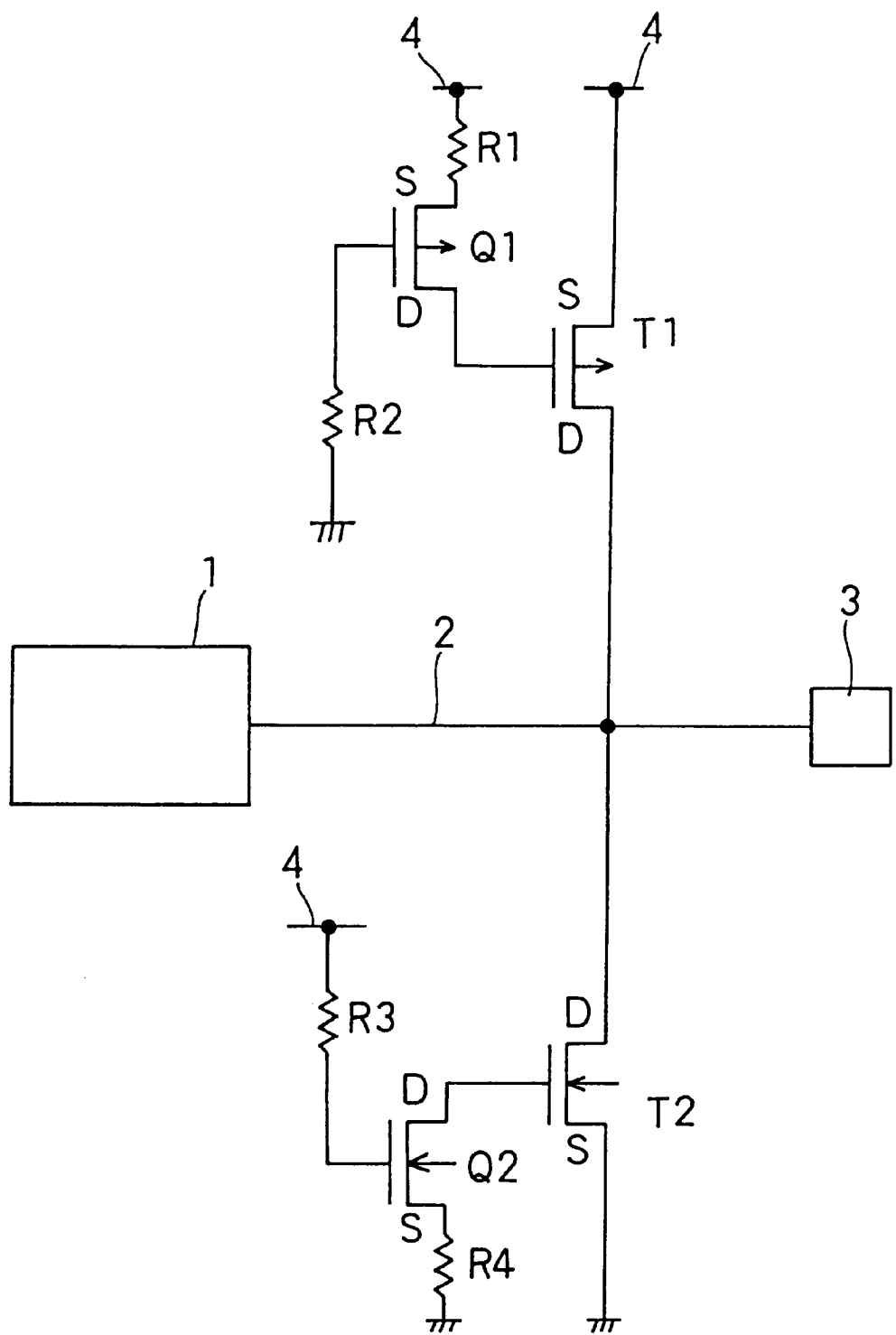
FIG. 3 is a circuit diagram of the static protection circuit for a semiconductor integrated circuit device of a third embodiment of the present invention.

FIG. 3 shows a third embodiment of the present invention. In FIG. 3, such components as are found also in FIGS. 1 and 2 are identified with the same reference numerals and symbols. The protection circuit shown in FIG. 3 is substantially composed of a protection circuit as shown in FIG. 1 and a protection circuit as shown in FIG. 2 connected in combination to the same signal line 2. Note however that, here, the transistor T1 has its drain connected to the signal line 2 and has its source connected to the power source line 4.

The protection circuit of the third embodiment is more resistant to abnormal electrostatic charge, and thus more reliable, than those of the first and second embodiments, because, in the third embodiment, two protection transistors T1 and T2 operate in response to electrostatic charge applied to the pad 3 from the outside.

Figure 4:
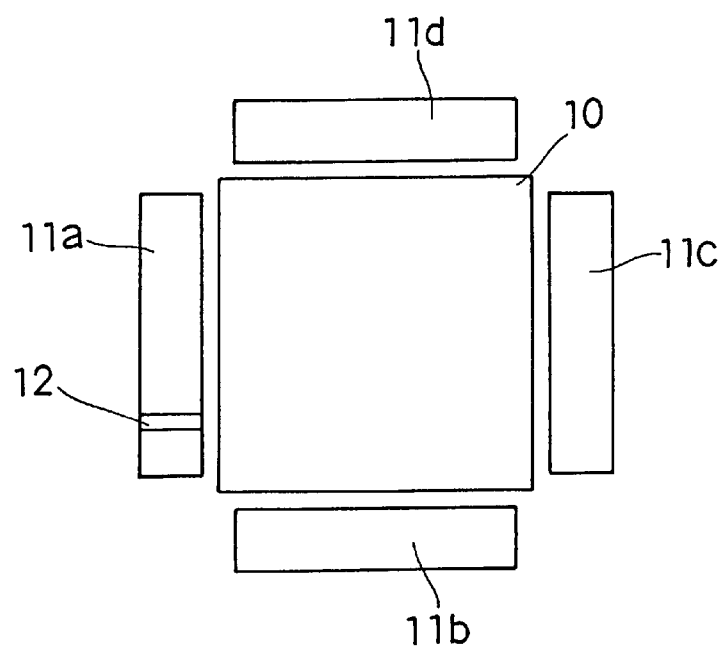
FIG. 4 is a diagram schematically illustrating the structure of a semiconductor integrated circuit device according to the present invention.
Figure 5:
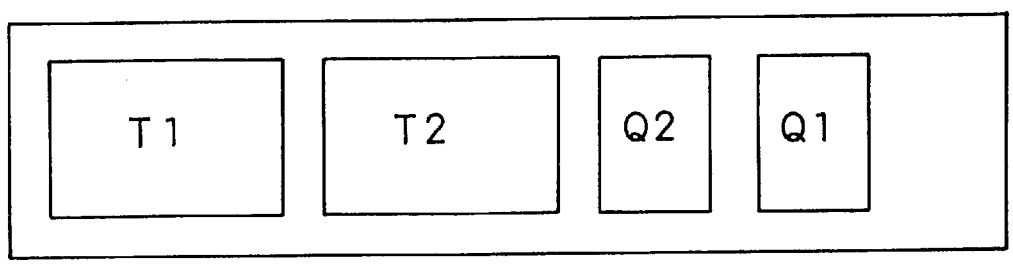
FIG. 5 is a diagram illustrating the layout of the I/O cell of the semiconductor integrated circuit device according to the present invention.

FIG. 4 shows the layout of the principal portion of a semiconductor integrated circuit device according to the present invention. Numeral 10 represents a core section, and numerals 11a to 11d represent I/O sections. Numeral 12 represents one I/O cell within the I/O section 11a. FIG. 5 shows the portion of the protection circuit for this I/O cell 12. In FIG. 5, the transistors T1, T2, Q1, and Q2 correspond to those identified with the same reference symbols in FIG. 3.

Figure 6:
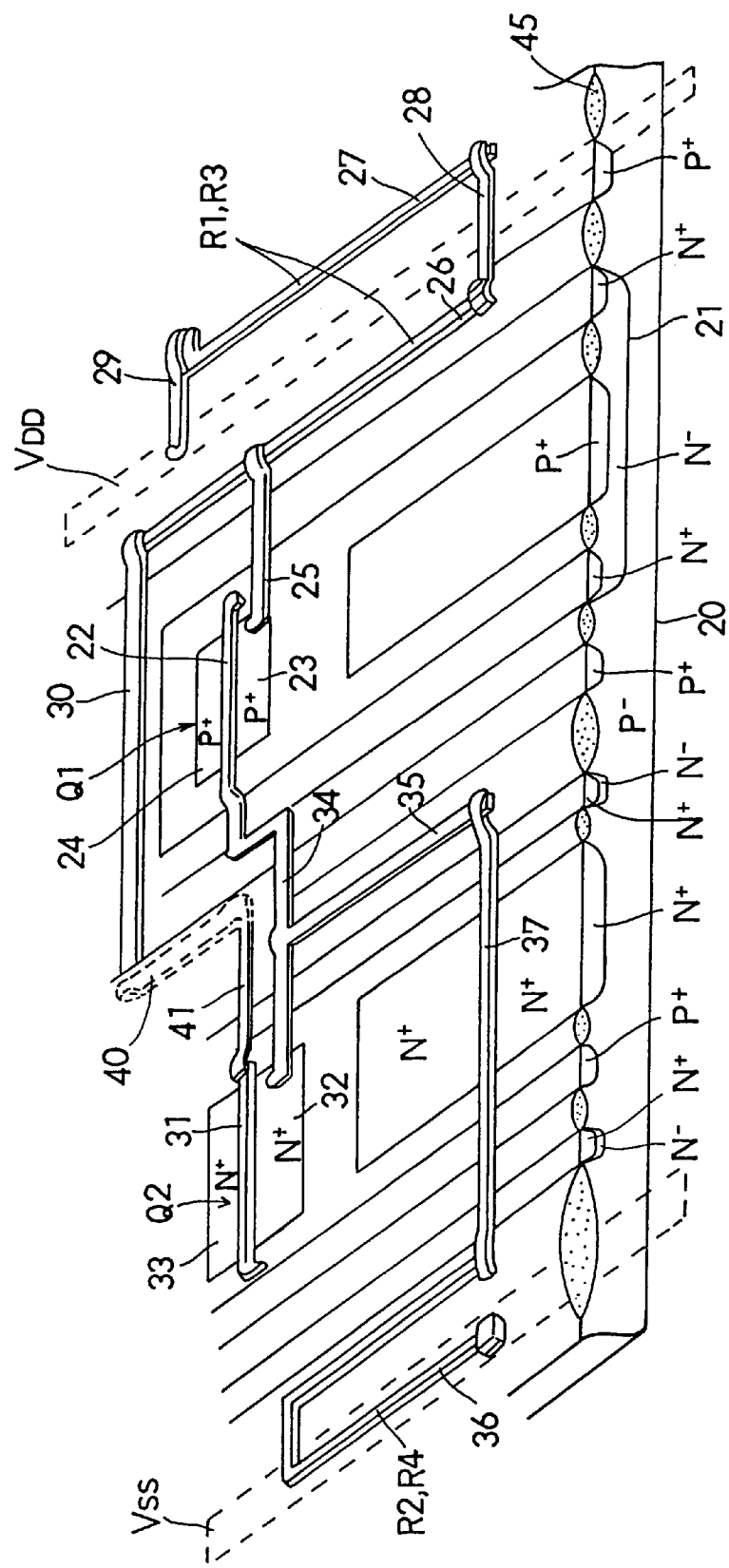
FIG. 6 is a diagram illustrating the structure of a part of the static protection circuit of the semiconductor integrated circuit device according to the present invention.
Figure 7:
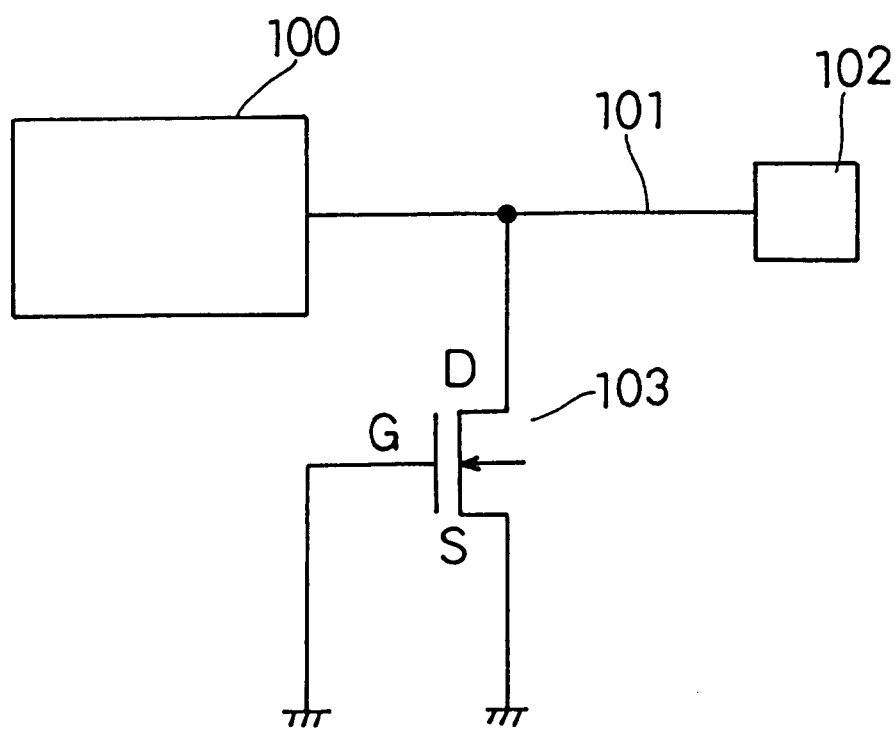
FIG. 7 is a circuit diagram of a conventional static protection circuit.

FIG. 6 schematically shows a practical example of the structure of the transistors Q1 and Q2 and the resistors R1 to R4 shown in FIG. 5. In FIG. 6, numeral 20 represents a P⁻ substrate, and numeral 21 represents an N well for a P-channel MOS transistor. The transistor Q1 is formed in a part of this N well 21. Numerals 23 and 24 represent source and drain regions, respectively. The source region 23 is connected to a resistive film 26 by way of a wire 25.

One end of the resistive film 26 is connected, by way of a wire 28, to one end of a resistive film 27. The other end of the resistive film 27 is connected, by way of a wire 29, to a power source line $V_{DD}$ laid in a second wiring layer. This power source line $V_{DD}$ corresponds to the power source line 4 in FIG. 3.

The resistive film 26 is connected, by way of wires 30 and 41 and a wire 40 formed in the second wiring layer, also to the gate electrode 31 of the transistor Q2. Numerals 32 and 33 represent the source and drain regions, respectively, of the transistor Q2. The source region 32 is connected, by way of a wire 34, to the gate electrode 22 of the transistor Q1, and also to one end of a resistive film 35.

The other end of the resistive film 35 is connected, by way of a wire 37, to one end of a U-shaped resistive film 36. The other end of this resistive film 36 is connected to a ground line $V_{ss}$ laid in the second wiring layer. In FIG. 6, the portions 45 whose section is illustrated with a dotted pattern are separation layers.

In this embodiment, by connecting the source region of the transistor Q1 and the gate electrode 31 of the transistor Q2 to the resistive film 26, the resistive films 26 and 27 are used both as R1 and as R3 shown in FIG. 3 (that is, the composite resistance of the resistive films 26 and 27 serves both as R1 and as R3). Moreover, by coupling the resistive film 35 to the gate electrode 22 of the transistor Q1 and the source region of the transistor Q2, the resistive films 35 and 36 are used both as R2 and as R4 shown in FIG. 3 (that is, the composite resistance of the resistive films 35 and 36 serves both as R2 and as R4).

By sharing a single resistive film as different resistors in this way, it is possible to reduce the number of resistive films required. This not only helps miniaturize semiconductor integrated circuit devices, but also helps secure as much freedom as possible in the layout of the wiring patterns in the first wiring layer.

As described heretofore, in the embodiments described above, the gate insulating film of the MOS transistor that is connected to a signal line for static protection is never destroyed by electrostatic charge applied from the outside. In addition, the voltage applied to the gate of the transistor that is connected between the gate of the above protection MOS transistor and the power source line or ground is reduced by resistors, and thereby the gate insulating film of this transistor is also protected from destruction due to abnormal electrostatic charge applied to the power source line. This makes it possible to realize a highly reliable protection circuit.

What is claimed is:

1. A static protection circuit for use in a semiconductor integrated circuit device, comprising:
    a first MOS transistor of a P-channel type whose source-drain channel is connected between a signal line leading to an external connection terminal and ground; and
    a second MOS transistor of a P-channel type having a drain connected to a gate of said first MOS transistor, having a source connected through a first resistor to a power source line, and having a gate connected through a second resistor to ground.

2. A static protection circuit for use in a semiconductor integrated circuit device, comprising:
    a first MOS transistor of an N-channel type whose source-drain channel is connected between a signal line leading to an external connection terminal and ground; and
    a second MOS transistor of an N-channel type having a drain connected to a gate of said first MOS transistor, having a gate connected through a first resistor to a power source line, and having a source connected through a second resistor to ground.

3. A static protection circuit for use in a semiconductor integrated circuit device, comprising:
    a first MOS transistor of a P-channel type whose source-drain channel is connected between a signal line leading to an external connection terminal and a power source line;
    a second MOS transistor of an N-channel type whose source-drain channel is connected between said signal line and ground;
    a third MOS transistor of a P-channel type having a drain connected to a gate of said first MOS transistor, having a source connected through a first resistor to the power source line, and having a gate connected through a second resistor to ground; and
    a fourth MOS transistor of an N-channel type having a drain connected to a gate of said second MOS transistor, having a gate connected through a third resistor to the power source line, and having a source connected through a fourth resistor to ground.

4. A static protection circuit for use in a semiconductor integrated circuit device as claimed in claim 3,
    wherein a second resistive film line is formed in a first wiring layer of said semiconductor integrated circuit device, with one end of said second resistive film line coupled to a ground line formed in a second wiring layer and the other end of said second resistive film line coupled to the gate of said third MOS transistor and also to the source of said fourth MOS transistor, so that said second resistive film line is used both as said second resistor and as said fourth resistor.

5. A static protection circuit for use in a semiconductor integrated circuit device as claimed in claim 3,
    wherein a first resistive film line is formed in a first wiring layer of said semiconductor integrated circuit device, with one end of said first resistive film line coupled to a power source line formed in a second wiring layer and the other end of said second resistive film line coupled to the source of said third MOS transistor and also to the gate of said fourth MOS transistor, so that said first resistive film line is used both as said first resistor and as said third resistor.

6. A static protection circuit for use in a semiconductor integrated circuit device as claimed in claim 5,
    wherein a second resistive film line is formed in a first wiring layer of said semiconductor integrated circuit device, with one end of said second resistive film line coupled to a ground line formed in a second wiring layer and the other end of said second resistive film line coupled to the gate of said third MOS transistor and also to the source of said fourth MOS transistor, so that said second resistive film line is used both as said second resistor and as said fourth resistor.

* * * * *